(12) United States Patent
Fukunaga

(10) Patent No.: US 6,790,065 B2
(45) Date of Patent: Sep. 14, 2004

(54) SOCKET FOR ELECTRIC PART

(75) Inventor: Masami Fukunaga, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 09/764,721

(22) Filed: Jan. 18, 2001

(65) Prior Publication Data

US 2001/0024896 A1 Sep. 27, 2001

(30) Foreign Application Priority Data

Jan. 18, 2000 (JP) ........................................ 2000-009282

(51) Int. Cl.[7] .............................................. H01R 11/22
(52) U.S. Cl. ........................ 439/266; 439/331; 439/525
(58) Field of Search .......................... 439/266, 71, 330, 439/331, 525, 526, 268

(56) References Cited

U.S. PATENT DOCUMENTS

| | | | | |
|---|---|---|---|---|
| 4,468,072 A | * | 8/1984 | Sadigh-Behzadi | 339/74 |
| 5,320,550 A | * | 6/1994 | Uratsuji et al. | 439/266 |
| 5,545,050 A | * | 8/1996 | Sato et al. | 439/331 |
| 5,669,780 A | * | 9/1997 | Fukunaga | 439/266 |
| 5,807,127 A | * | 9/1998 | Ohshima | 439/266 |
| 6,086,392 A | * | 7/2000 | Okabe | 439/157 |
| 6,106,319 A | * | 8/2000 | Fukunaga et al. | 439/342 |
| 6,142,792 A | * | 11/2000 | Yang | 439/70 |
| 6,261,114 B1 | * | 7/2001 | Shimada | 439/266 |
| 6,280,219 B1 | * | 8/2001 | Sano et al. | 439/268 |

* cited by examiner

*Primary Examiner*—P. Austin Bradley
*Assistant Examiner*—Edwin A. Leon
(74) *Attorney, Agent, or Firm*—Koda & Androlia

(57) ABSTRACT

In a socket for an electric part, two slide plates 15 and 16 slidably mounted are slid in different directions by applying an urging force for urging an upper operating member 18 downwards, thereby resiliently resilient pieces 5a and 5b of a contact pin 4 in spacing directions to open out contact portions 7. The slide plates 15 and 16 are slid back to their original positions by releasing the urging force to the upper operating member 18, thereby decreasing the resilient deformation of the resilient pieces 5a and 5b in approaching directions to close the contact portions 7 of the contact pin 4. In this manner, the electric part is clamped. Thus, the contact portions can be opened out in equal resiliently deformed amounts by equally pressing the resilient pieces constituting the contact pin.

4 Claims, 5 Drawing Sheets

SOCKET FOR ELECTRIC PART

BACKGROUND OF THE INVENTION

1. Field of the Invention

The present invention relates to a socket for an electric part, which is designed so that an electric part such as a semiconductor device or the like is detachably retained thereon, and particularly, to a socket for an electric part, which is designed so that terminals of the electric part are electrically connected to contact portions of contact pins of the socket for the purpose of carrying out a performance test for the electric part.

2. Description of the Related Art

In order to carry out the performance test for an electric part such as a semiconductor device, many electric part sockets are conventionally used to electrically connect terminals of the electric part to a printed wiring board of a measurer.

Such a socket for an electric part includes a top plate disposed on a socket body for placement of the electric part, contact pins disposed on the socket body and each having a pair of resilient pieces, a slide plate disposed between the top plate and the socket body for sliding movement in a horizontal direction, and an upper operating member movable vertically relative to the socket body in order to move the slide plate.

In placing the socket into use, the upper operating member is lowered to slide the slide plate horizontally, thereby resiliently deforming one of the resilient pieces constituting the contact pin to open out an upper end thereof. Thereafter, the upper operating member is raised with the electric part placed on the top plate, thereby returning the slide plate to its original position and releasing a pressing force to the contact pin. Thus, the retracted resilient piece of the contact pin is returned to its initial position, whereby the upper end of each of the contact pins clamps corresponding one of the terminals of the electric part. In this manner, the contact portions formed at the upper end are brought into abutment against the terminal to provide an electric connection.

In such conventional socket, however, only one of the resilient pieces of the contact pin is resiliently deformed and for this reason, there is a possibility of a scattering of the opening-out and closing of the contact pin.

Specifically, if only one of the resilient pieces constituting the contact pin is pressed by moving the slide plate, a reaction force is applied from such resilient piece to the slide plate to lose the balance of engagement of the upper operating member for sliding the slide plate in the horizontal direction with the socket body, thereby causing the scattering the opening-out and closing of the contact pin.

In a state in which the opening-out and closing of the contact pin is not uniform, as described above, it is difficult to clamp the terminals of the electric part by the contact pins, respectively, resulting in a reduced operating efficiency.

Another problem is as follows: When only the one resilient piece of the contact pin is resiliently deformed for opening-out of its upper end, a increased deviation is produced between a position at the time of insertion of each of the terminals of the electric part into the opened-out upper end of the contact pin and a position at the time of clamping of the terminal between the contact portions at the upper end. Therefore, in order to the contact the electric part and guide portions formed on the top plate on the socket body for locating the electric part in a predetermined position, it is necessary to provide a large gap between the electric part and the guide portions, resulting in a poor mountability of the electric part to the electric part socket.

SUMMARY OF THE INVENTION

Accordingly, it is an object of the present invention to provide a socket for an electric part, wherein the resilient pieces constituting each of the contact pins can be opened out in equal resiliently deformed amounts by equally pressing the resilient pieces.

To achieve the above object, according to the present invention, there is provided a socket for en electric part, comprising a socket body, a plurality of contact pins disposed on the socket body and each capable of clamping corresponding one of terminals of an electric part placed on a rest face of the socket body between contact portions formed at tip ends of a pair of resilient pieces, and two slide plates mounted for sliding movement in different directions relative to the socket body by an urging motion of the upper operating member, so that the slide plates are slid in the different directions by applying a pressing force for urging the upper operating member downwards to resiliently deform the resilient pieces in spacing directions, thereby opening-out the contact portions of the contact pin, and so that the slide plates are slid back to their original position by releasing the pressing force to the upper operating member, thereby decreasing the resilient deformation of the resilient pieces in approaching directions to move the contact portions of the contact pin toward each other, thus clamping each of the terminals of the electric part.

With the above arrangement, the upper end of the contact pin can be opened out in center symmetry by displacing the resilient pieces in the same amount in the different directions. Thus, the positions at the time of insertion of each of the terminals of the electric part into the upper end and at the time of clamping of the terminal on the upper end cannot be changed from each other, thereby enabling the enhancement of the mountability of electric part.

According to another aspect of the present invention, in addition to the above feature, pressing members are formed between the two slide plates and interposed between the pair of resilient pieces for applying resiliently deforming forces to the corresponding resilient pieces at substantially symmetric locations during opening-out of the contact portions of each of the contact pins.

With the above arrangement, it is possible to ensure that the reaction force from the pressing force on the slide plate is equal at both of the resilient pieces. Therefore, it is possible to maintain the balance of engagement of the socket body with the upper operating member for sliding the slide plates in the horizontal direction, thereby preventing a scattering from being produced in opening-out and closing of the contact pin.

The above and other objects, features and advantages of the invention will become apparent from the following description of the preferred embodiment taken in conjunction with the accompanying drawings.

DESCRIPTION OF THE PREFERRED EMBODIMENTS

Figure 1:
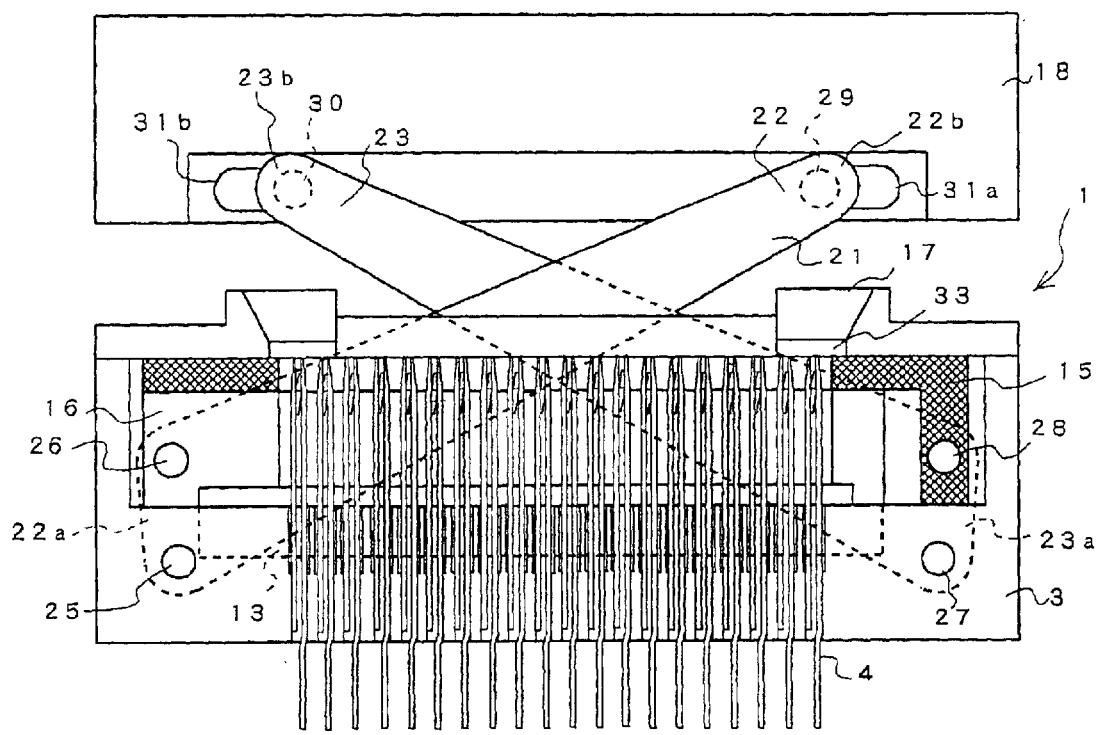
FIG. 1 is a side view showing slide plates of a socket for an electric part according to the present invention in their usual states.

The present invention will now be described by way of an embodiment with reference to FIGS. 1 to 5.

A socket 1 for an electric part according to an embodiment of the present invention is adapted to electrically connect a solder balls arranged as terminals of an electric part (not shown) such as an IC package in a lattice fashion and a printed wiring board (not shown) for a measurer in order to carry out a performance test of the electric part.

The socket 1 for the electric part has a socket body 2 mounted on the printed wiring board, and a plurality of contact pins 4 are arranged in a lattice fashion on the socket body 2 to correspond to the solder balls as the terminals of the electric part.

The contact pins 4 are formed integrally with one another, so that each of them has a pair of resilient pieces 5a and 5b of an excellent conductive plate material. The resilient pieces 5a and 5b are formed so that they are opposed to each other, by folding a base portion 6 into a substantially U-shape.

Figure 3:
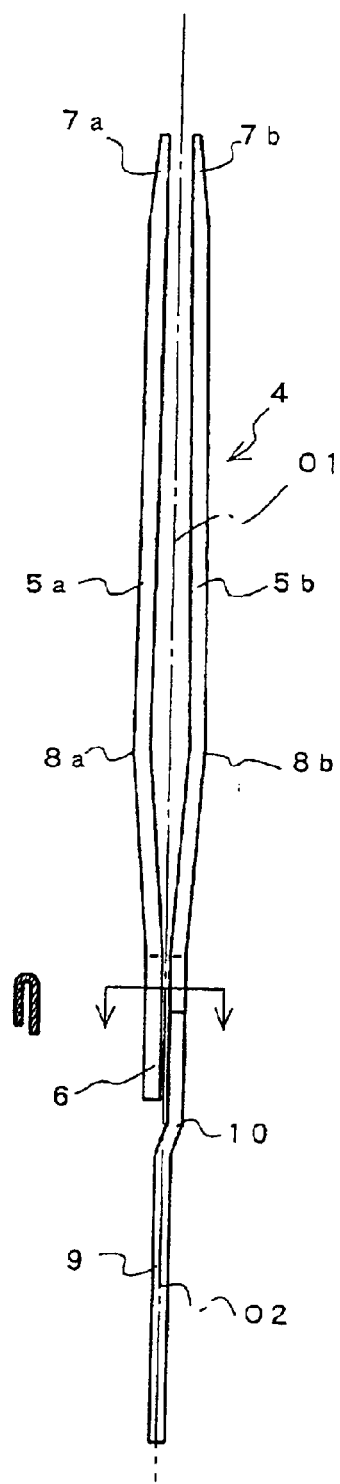
FIG. 3 is a front view showing the shape of a contact pin of the electric part socket according the present embodiment.

The resilient pieces 5a and 5b are provided at their tip ends with contact portions 7a and 7b, respectively, which are adapted to be brought into and out of contact with the solder ball 2 of the electric part, so that the solder ball 2 is clamped by both of the contact portions 7a and 7b. The resilient pieces 5a and 5b are folded at their intermediate portions in spacing directions to form folded portions 8a and 8b, respectively. Further, the contact pin 4 is formed at its lower portion with a single solder tail portion 9 which is folded at a point 10 near the base of the resilient piece 5, so that a center line O1 between the pair of resilient pieces 5a and 5b is aligned with a center line O2 of the solder tail portion 9, as shown in FIGS. 3 and 4.

Figure 4:
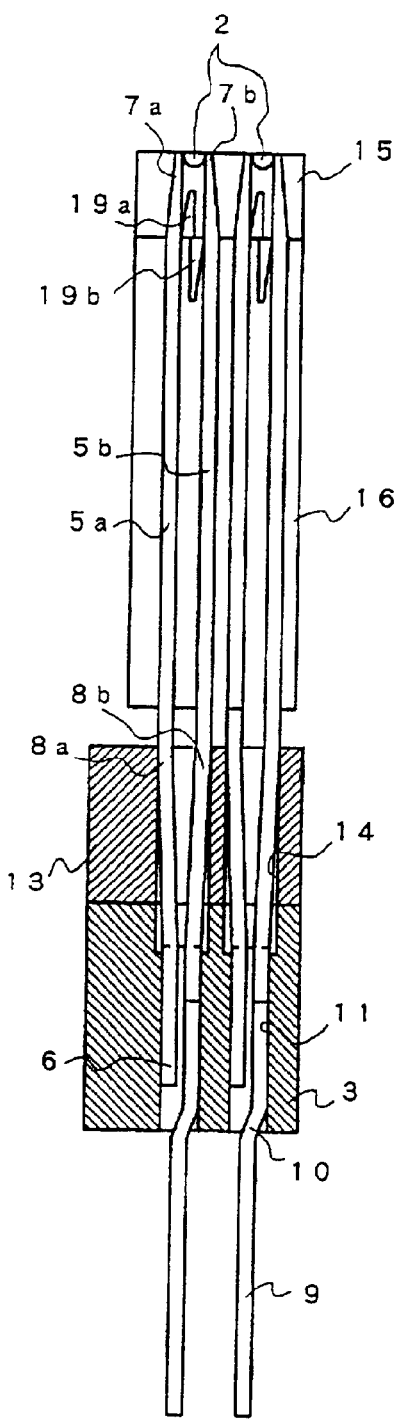
FIG. 4 is a front view showing the contact pin shown in FIG. 3 in its opened-out state.

The solder tail portion 9 and the base portion 6 of the contact pin 4 are press-fitted into a press-fit bore 11 defined in the socket body 3, as shown in FIG. 4. The solder tail portion 9 protruding downwards from the socket body 3 is further extended downwards through a locating board (not shown) and adapted to be inserted through and each of through-bores in the printed wiring board (not shown) and connected to the printed wiring board by soldering.

A pressing plate 13 as a pressing means is detachably disposed on an inner bottom surface of the socket body 3, so that the contact pin 4 is inserted through the pressing plate 13. The pressing plate 13 has a pressing bore 14 defined therein, into which the resilient pieces 5a and 5b of the contact pin 4 are inserted. The width of the pressing bore 14 is set, so that the resilient pieces 5a and 5b are pressed in directions of movement of the contact portions 7a and 7b toward each other and thus resiliently deformed in states in which they have being inserted into the pressing bore 14. In the present embodiment, top points of the folded portions 8a and 8b formed on the pair of resilient pieces 5a and 5b of the contact pin 4 are pressed by an inner wall of the pressing bore 14.

Figure 2:
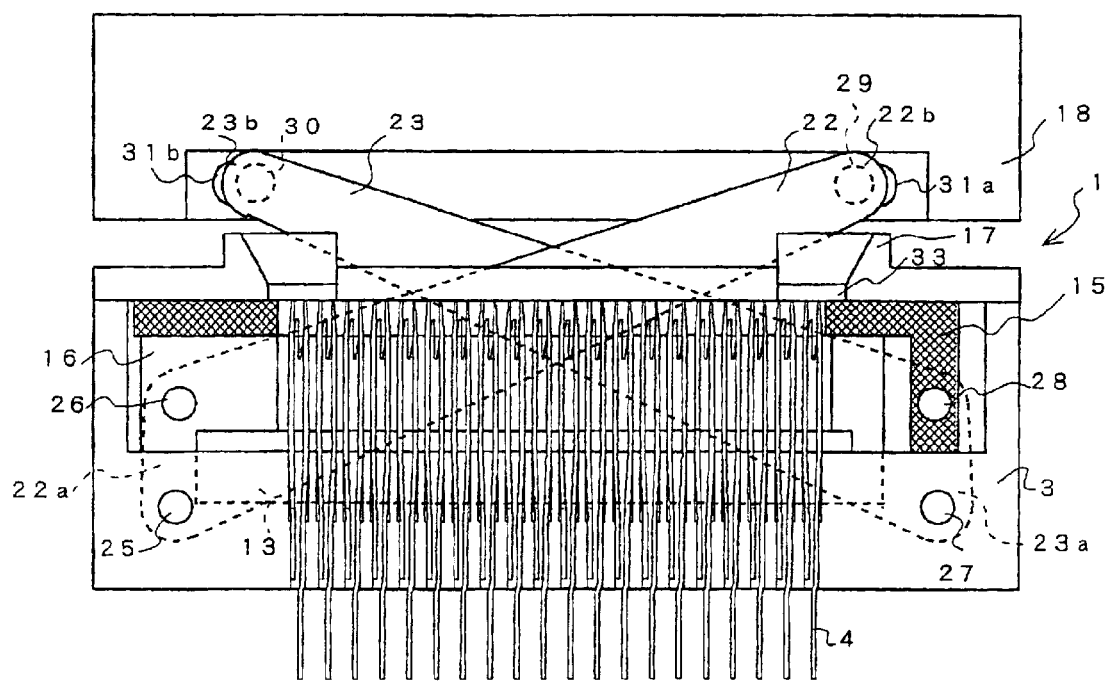
FIG. 2 is a side view showing the slide plates of the socket shown in FIG. 1 in their slid states.

Further, an upper slide plate 15 and a lower slide plate 16 are disposed in a laminated manner above the pressing plate 13 for sliding movements in a lateral direction (in a horizontal direction) as viewed in FIGS. 1 and 2. The resilient pieces 5a and 5b of each of the contact pins 4 disposed on the socket body 3 are resiliently deformed, so that they are displaced, or such displacement is cancelled, by sliding the slide plates 15 and 16. Namely, the slide plates 15 and 16 are adapted to be slid in different directions by the same distance through a lever member assembly 21 pivotally supported on the socket body and shown in FIGS. 1 and 2, by vertically moving an upper operating member 18 disposed above the a top plate 17.

An upper pressing portion 19a is formed on the upper slide plate 15 and interposed between the resilient pieces 5a and 5b of the contact pin 4, so that the resilient piece 5a can be pressed and resiliently deformed by the sliding movement of the upper slide plate 15, as shown in FIG. 4. A lower pressing portion 19b is also formed on the lower slide plate 16 and located between the resilient pieces 5a and 5b, so that the resilient piece 5b can be pressed and resiliently deformed by the sliding movement of the lower slide plate 16.

In the present embodiment, the upper pressing portion 19a is formed into a wedge shape with its thickness decreased upwards, so that its lower end portion is brought into abutment against the inner surface of the resilient piece 5a.

The lower pressing portion 19b is formed into a wedge shape with its thickness decreased downwards, so that its upper end portion is brought into abutment against the inner surface of the opposed resilient piece 5a.

The pressing portions 19a and 19b are disposed between resilient pieces 5a and 5b of each of the contact pins 4 to assume a diamond shape in section in predetermined locations by the opposed disposition of a lower end face of the upper pressing portion 19 and an upper end face of the lower pressing portion 18b in proximity to each other. Thus, the positions of the contact portions 7 of the resilient pieces 5a and 5b are established at points about the center line O1 between the resilient pieces 5a and 5b, as shown in FIG. 3.

The lever member assembly 21 pivotally supported on the socket body is disposed in correspondence to opposite side faces of the rectangular slide plates 15 and 16 in the sliding direction, and has a levering action.

Specifically, the lever member assembly 21 includes a first lever member 22 and a second lever member 23 which have the same length, as shown in FIGS. 1 and 2.

The first lever member 22 is turnably connected at its lower end 22a to the socket body 3 and an end of one of the side faces of the lower slide plate 15 in the sliding direction by lower end-connecting pins 25 and 26, respectively, and the second lever member 23 is turnably connected at its lower end 23a to the socket body 3 and an end of the side faces of the upper slide plate 15 in the sliding direction by lower end-connecting pins 27 and 28, respectively.

The first and second lever members 22 and 23 are also movably connected at their upper ends 22b and 23b to the upper operating member 18 by upper end-connecting pins 29 and 30, respectively. An elongated bore 31a is provided in the upper operating member 18 at its portion connected to the upper end 22b of the first lever member 22, and the first lever member 22 is connected to the upper operating member 18 through the elongated bore 31a by the upper end-connecting pin 29. An elongated bore 31b is provided in the upper operating member 18 at its portion connected to the upper end 23b of the second lever member 23 and the second lever member 23 is connected to the upper operating member 18 through the elongated bore 31b by the upper end-connecting pin 30.

The upper slide plate 15 supports the upper end of the contact pin 4; and the top plate 17 is disposed on the upper surface of the upper slide plate 15, and has guide portions 33 provided thereon in correspondence to corners of an electric part for positioning the electric part, as shown in FIGS. 1 and 2.

Figure 5:
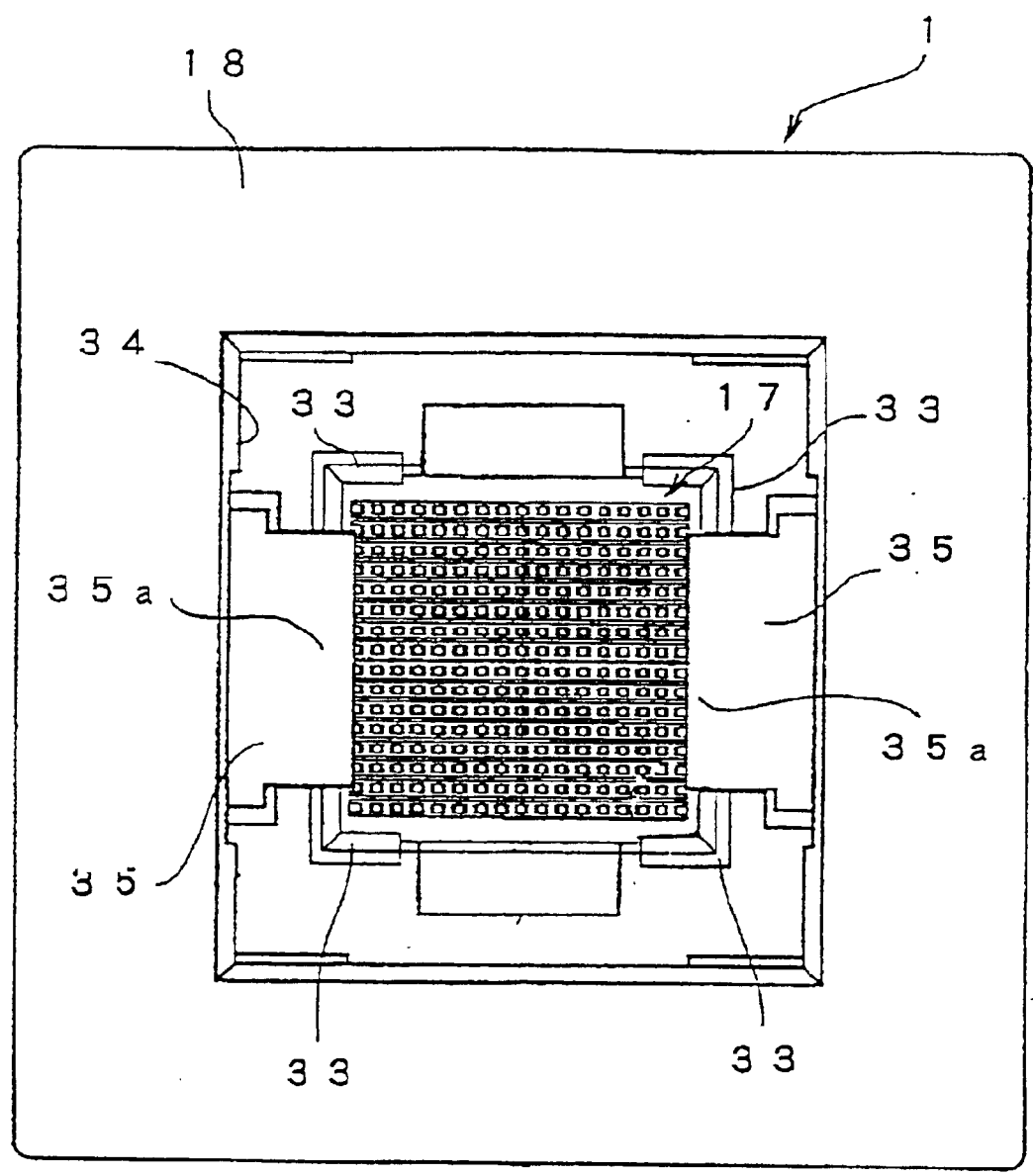
FIG. 5 is a plan view of the socket for the electric part according to the present invention.

Further, an opening 34 is defined in the upper operating member 18 at a size enabling the insertion of the electric part, as shown in FIG. 5, so that the electric part is inserted through the opening 34 and placed at a predetermined location along the guide portions 33 of the top plate 17.

The upper operating member 18 is disposed for vertical movement relative to the socket body and biased upwards by a spring (not shown), and has an operating projection (not shown) formed thereon for turning latches 35.

Each of the latches 35 is mounted for movement about a mounting axis relative to the socket body 3, and has a retaining portion 35a provided at its tip end, so that the retaining portion 35a is biased by a biasing force of a spring in a direction to come into contact with the upper surface of the top plate 17, thereby retaining a peripheral edge of the electric part. The latch 35 is formed with a portion urged by the operating projection of the upper operating member 18. When the upper operating member 18 is lowered, the urged portions are urged by the operating projection, whereby the latches 35 are turned, so that the retaining portions 35a are retracted from the position of disposition of the electric part.

The movement of the electric part socket constructed as described above will be described below.

To set the electric part on the electric part socket 1, the upper operating member 18 is pushed downwards. This causes the upper slide plate 15 to be slid leftwards as viewed in FIG. 2 through the lever member 21, whereby the resilient piece 5a of the contact pin 4 is pressed leftwards and resiliently deformed by the upper pressing portion 19a of the upper slide plate 15. The lower slide plate 16 is also slid rightwards, whereby the resilient piece 5b of the contact pin 4 is pressed rightwards and resiliently deformed by the lower pressing portion 19b of the lower slide plate 16.

At this time, in the present embodiment, the position of contact of the upper pressing portion 19a formed on the upper slide plate 15 with the resilient piece 5a and the position of contact of the lower pressing portion 19b formed on the lower slide plate 16 are set on the substantially same line, and a resiliently deforming force is applied in a position of symmetry of the resilient pieces 5a and 5b.

Namely, the position of contact of the lower end side of the upper pressing portion 19a formed on the upper slide plate 15 with the resilient piece 5a and the position of contact of the upper end side of the lower pressing portion 19b formed on the lower slide plate 16 with the resilient piece 5b are spaced at substantially equal distances apart from the base portion 6 of the contact pin 4. Therefore, the resilient pieces 5a and 5b contacting with each other can be pressed by equal forces and resiliently deformed in equal amounts in different directions, whereby the upper end of the contact pin 4 can be opened out.

By opening out the upper end of the contact pin 4 in equal amounts laterally symmetrically from the center line in the above manner, it is possible to extremely decrease the deviation between a position at the time of insertion of each of the solder balls 2 as the terminals of the electric part into the opened-out upper end of the contact pin 4 and a position at the time of clamping of the solder ball 2 between the contact portions 7a and 7b at the upper end. Therefore, it is possible to enhance the mountability of the electric part to the electric part socket 1.

When the equal pressing forces are applied to the resilient pieces 5a and 5b, as described above, reaction forces from the resilient pieces 5a and 5b to the slide plates 15 and 16 are substantially equal to each other. Therefore, it is possible to maintain a balance of engagement of the upper operating member 18 with the socket body 3 and hence, it is possible to prevent the scattering of the opening-out and closing of the upper end of the contact pin 4.

At the same time, the urged portion of the latch 35 is urged by the operating projection of the upper operating member 18, whereby the retaining portion 35a is displaced to a retracted position against the biasing force of the spring.

In this state, the electric part is guided by the guide portions 33 of the top plate 17 and placed in the predetermined position, and each of the solder balls 2 of the electric part is inserted between the pair of the opened-out contact portions 7a and 7b of each contact pin 4 into a non-contact state.

When the downward urging force to the upper operating member 18 is then released, the upper operating member 18 is raised by the biasing force of the spring, thereby causing the upper slide plate 15 to be slid in the rightward direction as viewed in FIG. 2 through the second lever member 23, while causing the lower slide plate 16 to be slid in the leftward direction as viewed in FIG. 2 through the first lever member 22.

When the slide plates 15 and 16 are slid as described above, the pressing force to the resilient pieces 5a and 5b of the contact pin 4 is released, causing the resilient pieces 5a and 5b to be restored to their original positions, whereby the solder ball 2 is clamped between the contact portions 7a and 7b.

Thus, the solder balls 2 of the electric part are electrically connected with the printed wiring board through the contact pins 4.

On the other hand, to remove the electric part from the mounted state, the upper operating member 18 is lowered to space the pair of contact portions 7a and 7b apart from each of the solder balls 2 of the electric part. Thus, the electric part can be removed simply by a force weaker than that in a case where the electric part is withdrawn from a state in which the solder ball 2 has been clamped between the pair of the contact portions 7a and 7b.

In such socket, the pressing plate 13 is mounted for pressing the intermediate portions of the resilient pieces 5a and 5b in the directions to decrease the spacing between the contact portions 7a and 7b to resiliently deform the resilient pieces 5a and 5b. Therefore, it is possible to set the amount of displacement (the pressing force) for resilient deformation of the resilient pieces 5a and 5b at any value and to set the pressure of contact of the contact portions 7a and 7b of the contact pin 4 with the solder ball 2 at an appropriate value.

The pressure of contact of the contact pin 4 with the solder ball 2 is ensured by applying the pressing pressure to the contact pin 4 using the pressing plate 13 and hence, the force for operating the contact pin 4 by the slide plates 15 and 16 can be decreased without use of a member having a large rigidity.

Further, the resilient pieces 5a and 5b of the contact pin 4 are folded at their intermediate portions in the spacing directions to form the folded portions 8a and 8b, respectively, and the top points of the folded portions 8a and 8b are pressed by the inner wall of the pressing bore 14 in the pressing plate 13. Therefore, the pressing force to the contact portions 7a and 7b can be set at a large value, as compared with a socket having resilient pieces 5a and 5b formed in parallel to each other.

Yet further, the pressing plate 13 is separate from the socket body 3 and can be replaced with a new pressing plate. Therefore, the pressing force can be changed easily only by replacing the pressing plate 13 with a pressing plate having a pressing bore 14 of a different size or the like.

In addition, in the present embodiment, the upper pressing portion 19a is clamped between the resilient pieces 5a and 5b of the contact pin 4 and hence, the centering of the contact portions 7a and 7b can be achieved, and the contact portions 7a and 7b can be positioned with a good accuracy.

Further, even when the resilient pieces 5a and 5b are pressed in a state in which the contact portions 7a and 7b of the contact pin 4 have been closed, the interference of the contact portions 7a and 7b with each other can be prevented, because the pressing portions 19a and 19b are interposed between the contact portions 7a and 7b.

Yet further, the pair of resilient pieces 5a and 5b of the contact pin 4 are formed so that they are opposed to each other, by folding the base portion 6, as shown in FIG. 3. Therefore, the contact pins 4 can be formed easily by subjecting a single plate material to a pressing treatment.

Yet further, the contact pin 4 is formed with the solder tail portion 9 folded in the vicinity of the base portion 6, so that the center line O1 between the resilient pieces 5a and 5b and the center line of the solder tail 9 are aligned with each other, as shown in FIG. 3. This is advantageous, for example, when the electric parts are transported by an automatic transporting machine, and their electric sections are set on a plurality of electric part sockets disposed on a printed wiring board. The alignment of the center lines O1 and O2 with each other means that each of the positions of disposition of the solder balls 2 is aligned with each of the positions of the through-bores in the printed wiring board. Therefore, when the electric part is transported by the automatic transporting machine, any position on the printed wiring board can be determined as a reference position. In this case, if a positional relationship is established between the reference position on the printed wiring board and the position of the through-bore, it is unnecessary to take a positional relationship between the printed wiring board and the electric part socket 1 into consideration, and the electric part can be set with a good accuracy in a predetermined position on the electric part socket 1.

Such an advantage need not be particularly insisted on, if the contact pin 4 is of a straight shape. In the present embodiment, however, the contact pin 4 is formed with the base portion 6 folded in such a manner that the pair of resilient pieces 5a and 5b are opposed to each other, with the solder tail portion 9 extending downwards from the base portion 6. For this reason, when the solder tail portion 9 is formed to merely extend downwards, the center lines O1 and O2 cannot be aligned with each other. Therefore, particularly, the center lines O1 and O2 are aligned with each other in the present embodiment by folding the solder tail portion 9 at the point 10 near the base portion 6 and hence, the above advantage is provided.

Although the embodiments of the present invention have been described in detail, it will be understood that the present invention is not limited to the above-described embodiments, and various modifications in design may be made without departing from the spirit and scope of the invention defined in claims.

What is claimed is:

1. A socket for an electric part, comprising a socket body, a plurality of contact pins disposed on said socket body and each capable of clamping corresponding one of terminals of an electric part placed on a rest face of said socket body between contact portions formed at tip ends of a pair of resilient pieces, and two slide plates mounted for horizontal sliding movement in different directions relative to said socket body by an upward and downward urging motion of an upper operating member, so that said slide plates are slid in the different directions by applying a pressing force for urging said upper operating member downwards to resiliently deform said resilient pieces in spacing directions, thereby opening-out the contact portions of said contact pin, and so that said slide plates are slid back to their original position by releasing the pressing force to said upper operating member, thereby decreasing the resilient deformation of said resilient pieces in approaching directions to displace the contact portions of said contact pin toward each other, thus clamping each of the terminals of the electric part.

2. A socket according to claim 1, wherein an X shaped lever member is provided between said upper operating member and said two slid plates whereby urging motion on said operating member is transmitted to said two slide plates.

3. A socket for an electric part, comprising a lower socket body, a plurality of contact pins disposed on said lower socket body and each capable of clamping a corresponding one of terminals of an electric part and each comprising a pair of opposing upwardly extending resilient pieces, two slide plates mounted for horizontal sliding movement in different directions relative to said socket body, each of said two slide plates including a plurality of pressing portions wherein one of said plurality of pressing portions from each of said two slide plates is provided between each of said pair of opposing upwardly extending resilient pieces of said plurality of contact pins, and an upper operating member coupled to said lower socket body and said two slide plates so that said two slide plates are slid in the different horizontal directions by applying a pressing force to said upper operating member for urging said upper operating member downwards to resiliently separate each of said pair of said opposing upwardly extending resilient pieces, thereby opening each of said pair of opposing upwardly extending resilient pieces of said plurality of contact pins and so that said two slide plates are horizontally slid back to their original position by releasing the pressing force to said upper operating member, thereby allowing each of said pair of opposing upwardly extending resilient pieces of said plurality of contact pins to approach each other, thus clamping each of the terminals of the electric part.

4. A socket for an electric part comprising a lower socket body, a plurality of contact pins disposed on said lower socket body and each capable of clamping a corresponding one of terminals of an electric part and each comprising a pair of opposing upwardly extending resilient pieces, two slide plates mounted for horizontal sliding movement in different directions relative to said socket body, each of said two slide plates including a plurality of pressing portions wherein one of said plurality of pressing portions from each of said two slide plates is provided between each of said pair of opposing upwardly extending resilient pieces of said plurality of contact pins, and an upper operating member coupled to said lower socket body and said two slide plates so that said two slide plates are slid in the different horizontal directions by applying a pressing force to said upper operating member for urging said upper operating member downwards to resiliently separate each of said pair of said opposing upwardly extending resilient pieces, thereby opening each of said pair of opposing upwardly extending resilient pieces of said plurality of contact pins and so that said two slide plates are horizontally slid back to their original position by releasing the pressing force to said upper operating member, thereby allowing each of said pair of opposing upwardly extending resilient pieces of said plurality of contact pins to approach each other, thus clamping each of the terminals of the electric part, and wherein said upper operating member is coupled to said two slide plates by means of a pair of lever members forming an X-shaped link mechanism.

* * * * *